US011445621B2

(12) United States Patent
Lin et al.

(10) Patent No.: US 11,445,621 B2
(45) Date of Patent: Sep. 13, 2022

(54) ELECTRIC-HEATING APPARATUS AND TOUCH DEVICE THEREIN

(71) Applicant: DELTA ELECTRONICS, INC., Taoyuan (TW)

(72) Inventors: I-Shen Lin, Taoyuan (TW); Sung-Jie Huang, Taoyuan (TW); Chih-Kuang Wang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/507,936

(22) Filed: Jul. 10, 2019

(65) Prior Publication Data
US 2020/0296844 A1    Sep. 17, 2020

(30) Foreign Application Priority Data
Mar. 15, 2019    (CN) .......................... 201910196735.9

(51) Int. Cl.
| H05K 5/00 | (2006.01) |
| H05K 1/02 | (2006.01) |
| H05B 1/02 | (2006.01) |
| H05K 1/18 | (2006.01) |
| H01R 12/71 | (2011.01) |

(52) U.S. Cl.
CPC ......... *H05K 5/0017* (2013.01); *H05B 1/0202* (2013.01); *H05K 1/0274* (2013.01); *H01R 12/71* (2013.01); *H05K 1/18* (2013.01); *H05K 2201/09063* (2013.01); *H05K 2201/10106* (2013.01); *H05K 2201/10151* (2013.01); *H05K 2201/10189* (2013.01)

(58) Field of Classification Search
CPC ... H05K 5/0017; H05K 1/0274; H05B 1/0202
See application file for complete search history.

(56) References Cited

U.S. PATENT DOCUMENTS

| 6,918,677 B2 | 7/2005 | Shipman |
| 8,259,089 B2 * | 9/2012 | Lee ...................... H03K 17/962 |
| | | 345/176 |

(Continued)

FOREIGN PATENT DOCUMENTS

| KR | 20180102924 A | * | 9/2018 |
| TW | 200530783 A | | 9/2005 |
| TW | 201415316 A | | 4/2014 |

OTHER PUBLICATIONS

Taiwanese Office Action corresponding to TW application No. 108108756 dated Aug. 10, 2020; :pp. 1-7.

*Primary Examiner* — Abhishek M Rathod
*Assistant Examiner* — Keith DePew

(57) ABSTRACT

A touch device is provided. The touch device includes a substrate, a light-emitting element, a light-shielding member, a sensing board, and a light-passing board. The light-emitting element is disposed on the substrate. The light-shielding member is disposed on the substrate, wherein the light-shielding member has a first opening, and the light-emitting element is located in the first opening. The sensing board is disposed on the light-shielding member, and is electrically connected to the substrate. The sensing board has a second opening, and the first opening and the second opening overlap. The light-passing board is disposed on the sensing board, and covers the first opening and the second opening.

20 Claims, 8 Drawing Sheets

(56) References Cited

U.S. PATENT DOCUMENTS

| | | | | |
|---|---|---|---|---|
| 8,748,767 B2* | 6/2014 | Ozias | ............. | G06F 1/1662 |
| | | | | 200/310 |
| 9,528,696 B2* | 12/2016 | Bach | ............. | F24C 7/083 |
| 2006/0262549 A1* | 11/2006 | Schmidt | ............. | G07C 9/0069 |
| | | | | 362/459 |
| 2008/0225016 A1* | 9/2008 | Lee | ............. | D06F 34/32 |
| | | | | 345/174 |
| 2011/0273375 A1* | 11/2011 | Wilford | ............. | H03K 17/962 |
| | | | | 345/173 |
| 2014/0009904 A1* | 1/2014 | Yang | ............. | G06F 3/0443 |
| | | | | 362/23.03 |
| 2014/0138228 A1* | 5/2014 | Chen | ............. | H01H 13/83 |
| | | | | 200/5 A |
| 2015/0002754 A1* | 1/2015 | Kim | ............. | G06F 3/0443 |
| | | | | 349/12 |
| 2016/0093452 A1* | 3/2016 | Zercoe | ............. | H01H 13/70 |
| | | | | 200/314 |
| 2017/0292712 A1* | 10/2017 | Alexander | ............. | G06F 3/04883 |
| 2018/0058747 A1* | 3/2018 | Yang | ............. | H03K 17/9643 |
| 2018/0082800 A1* | 3/2018 | Wang | ............. | H01H 13/83 |
| 2019/0056825 A1* | 2/2019 | Lin | ............. | G06F 3/0412 |
| 2019/0346974 A1* | 11/2019 | Lin | ............. | G06F 3/016 |
| 2020/0041195 A1* | 2/2020 | Park | ............. | G06F 3/0414 |
| 2020/0082659 A1* | 3/2020 | Scheckelhoff | ............. | G06Q 20/403 |

* cited by examiner

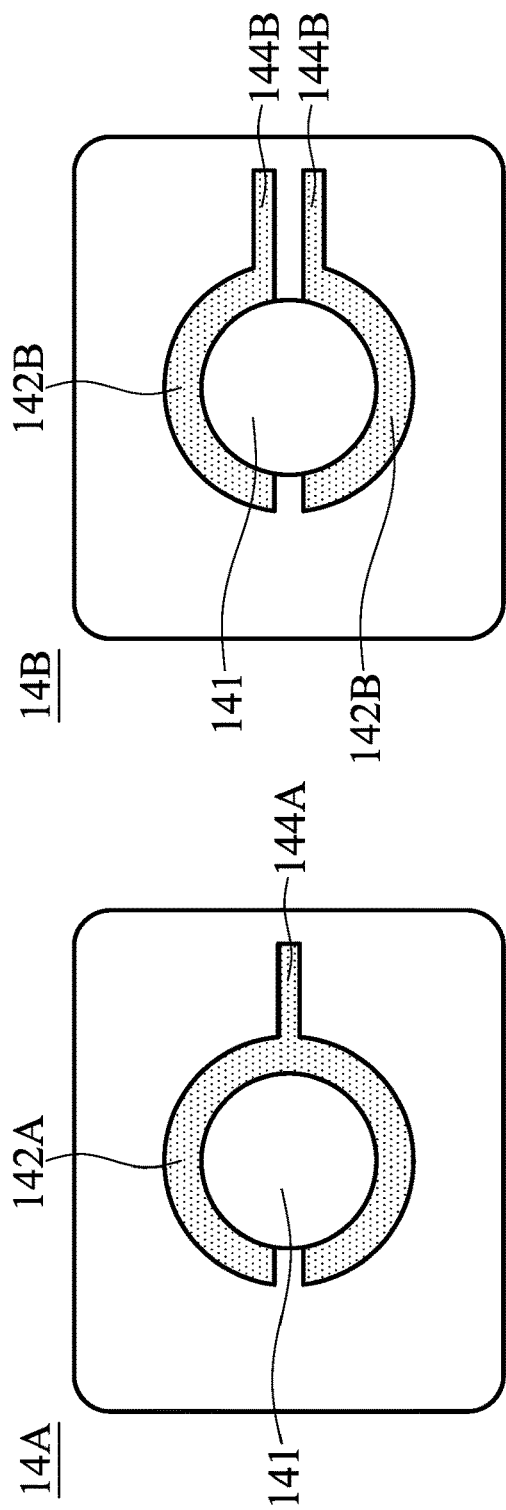
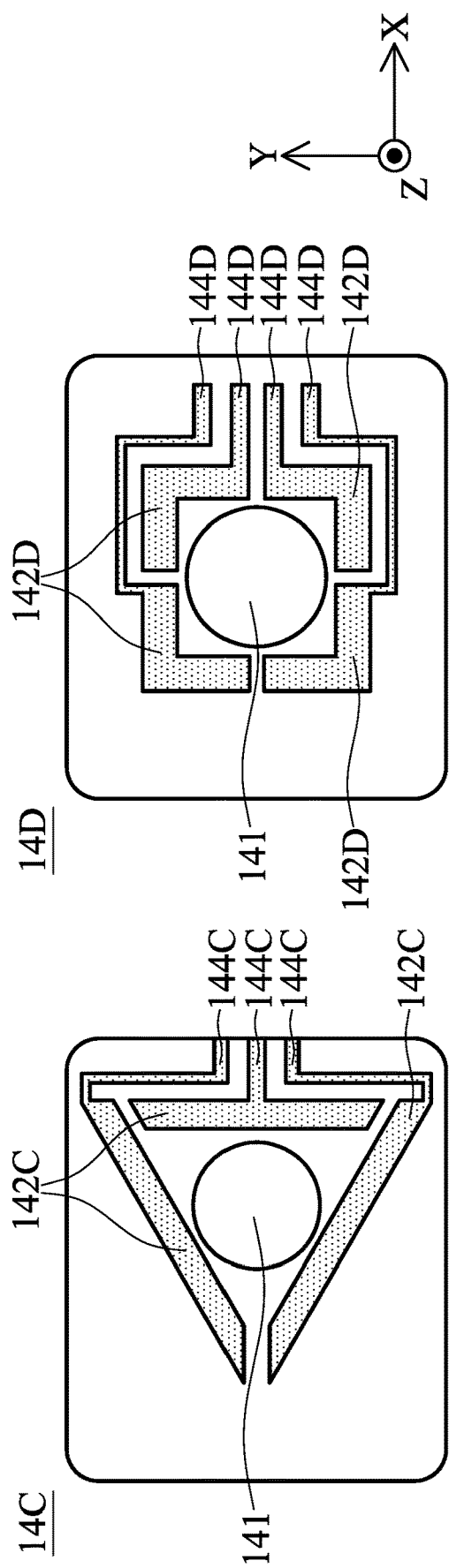
FIG. 5A  FIG. 5B  FIG. 5C  FIG. 5D

ELECTRIC-HEATING APPARATUS AND TOUCH DEVICE THEREIN

CROSS REFERENCE TO RELATED APPLICATIONS

This application claims priority of China Patent Application No. 201910196735.9, filed Mar. 15, 2019, the entirety of which is incorporated by reference herein.

BACKGROUND

Technical Field

The disclosure relates to an electric-heating apparatus and a touch device therein, and in particular to a touch device that includes a sensing board with an opening.

Description of the Related Art

As technology continues to develop, the touch-control technique has been adopted in a variety of electronic products in order to provide users with a better operating experience. Sensors of existing touch devices are generally made by embedding conductive circuits into transparent flexible plates and then printing opaque ink or paint on the flexible plates. Accordingly, the remaining unprinted portion is a pattern that light may pass through. Since the flexible plates need to be made of specific materials with a certain permeability to light, and a printing process needs to be performed, the cost of the process may go up, and it is difficult to reduce the overall size. In addition, in order to show the pattern of the touch devices, light-emitting diodes (LED) or other similar illuminating devices need to be disposed below the sensors. However, the illuminated region of the illuminating device is usually different from the region as originally designed.

BRIEF SUMMARY

For solving the aforementioned problems, some embodiments of the present disclosure provide a touch device. The touch device includes a substrate, a light-emitting element, a light-shielding member, a sensing board, and a light-passing board. The light-emitting element is disposed on the substrate. The light-shielding member is disposed on the substrate, wherein the light-shielding member has a first opening, and the light-emitting element is located in the first opening. The sensing board is disposed on the light-shielding member, and is electrically connected to the substrate. The sensing board has a second opening, and the first opening and the second opening overlap. The light-passing board is disposed on the sensing board, and covers the first opening and the second opening.

In an embodiment, the touch device further includes a thin film disposed between the sensing board and the light-passing board. A pattern is formed on the thin film, and the light emitted by the light-emitting element passes through the thin film and shows the pattern. In an embodiment, a pattern is formed on the light-passing board, and the light emitted by the light-emitting element passes through the light-passing board and shows the pattern.

In an embodiment, the sensing board further includes a sensing circuit surrounding the second opening, wherein the sensing circuit includes a plurality of contacts disposed in parallel connection. In an embodiment, the substrate further includes a first connecting member, the sensing board further includes a second connecting member, and the first connecting member is electrically connected to the second connecting member. The light-shielding member further has a hole, and the first connecting member is electrically connected to the second connecting member via the hole.

In an embodiment, the sensing board further includes a first sensing board and a second sensing board, the first sensing board is located inside an opening of the second sensing board and electrically isolated from the second sensing board.

Some embodiments of the present disclosure provide an electric-heating apparatus. The electric-heating apparatus includes a body, a heating device, and a touch device. The heating device is disposed in the body. The touch device is disposed in the body and is configured to control the operating status of the heating device. The touch device includes a substrate, a plurality of light-emitting elements, a light-shielding member, a sensing board, and a light-passing board. The light-emitting elements are disposed on the substrate. The light-shielding member is disposed on the substrate, wherein the light-shielding member has a plurality of first openings, and the light-emitting elements are correspondingly located in the first openings. The sensing board is disposed on the light-shielding member, and is electrically connected to the substrate, wherein the sensing board has a plurality of second openings, and the first openings and the second openings overlap. The light-passing board is disposed on the sensing board, and is configured to cover the first openings and the second openings.

BRIEF DESCRIPTION OF THE DRAWINGS

The disclosure can be more fully understood by reading the subsequent detailed description and examples with references made to the accompanying drawings, wherein:

FIGS. 5A-5D are top views illustrating a sensing board in accordance with some embodiments of the present disclosure.

DETAILED DESCRIPTION OF THE INVENTION

The touch devices of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
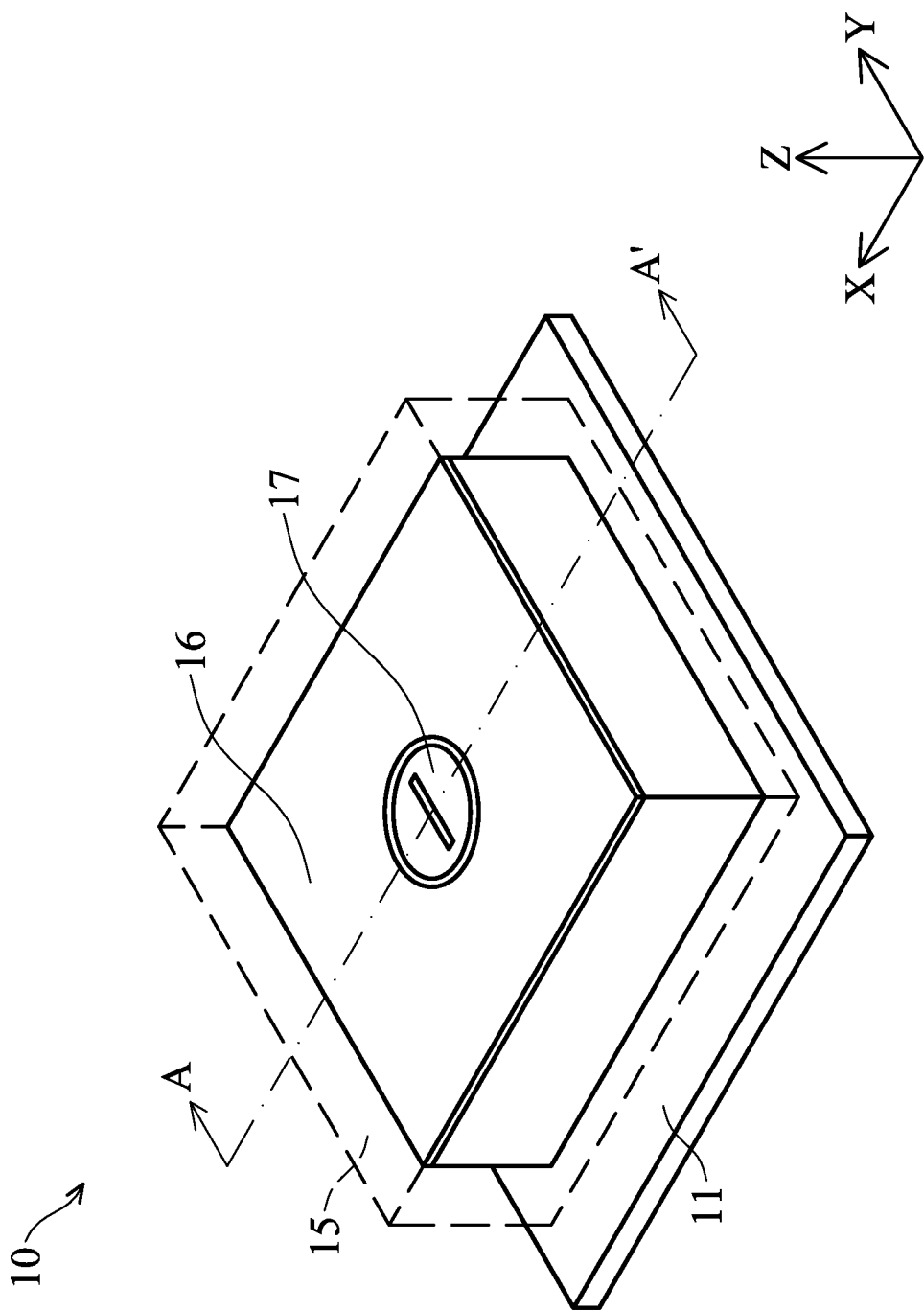
FIG. 1 is a perspective view illustrating a touch device in accordance with an embodiment of the present disclosure.

FIG. 1 is a perspective view illustrating a touch device 10 in accordance with an embodiment of the present disclosure. It should be noted that the touch device 10 in the present embodiment may be disposed in a variety of electronic apparatuses, and may detect force exerted from outside and generate electric signals which are sent to a control unit (not shown) in the electronic apparatuses. The control unit may switch the operating status of the electronic apparatuses and/or show different patterns according to the electric signals. Therefore, the touch-control function may be achieved.

Figure 2:
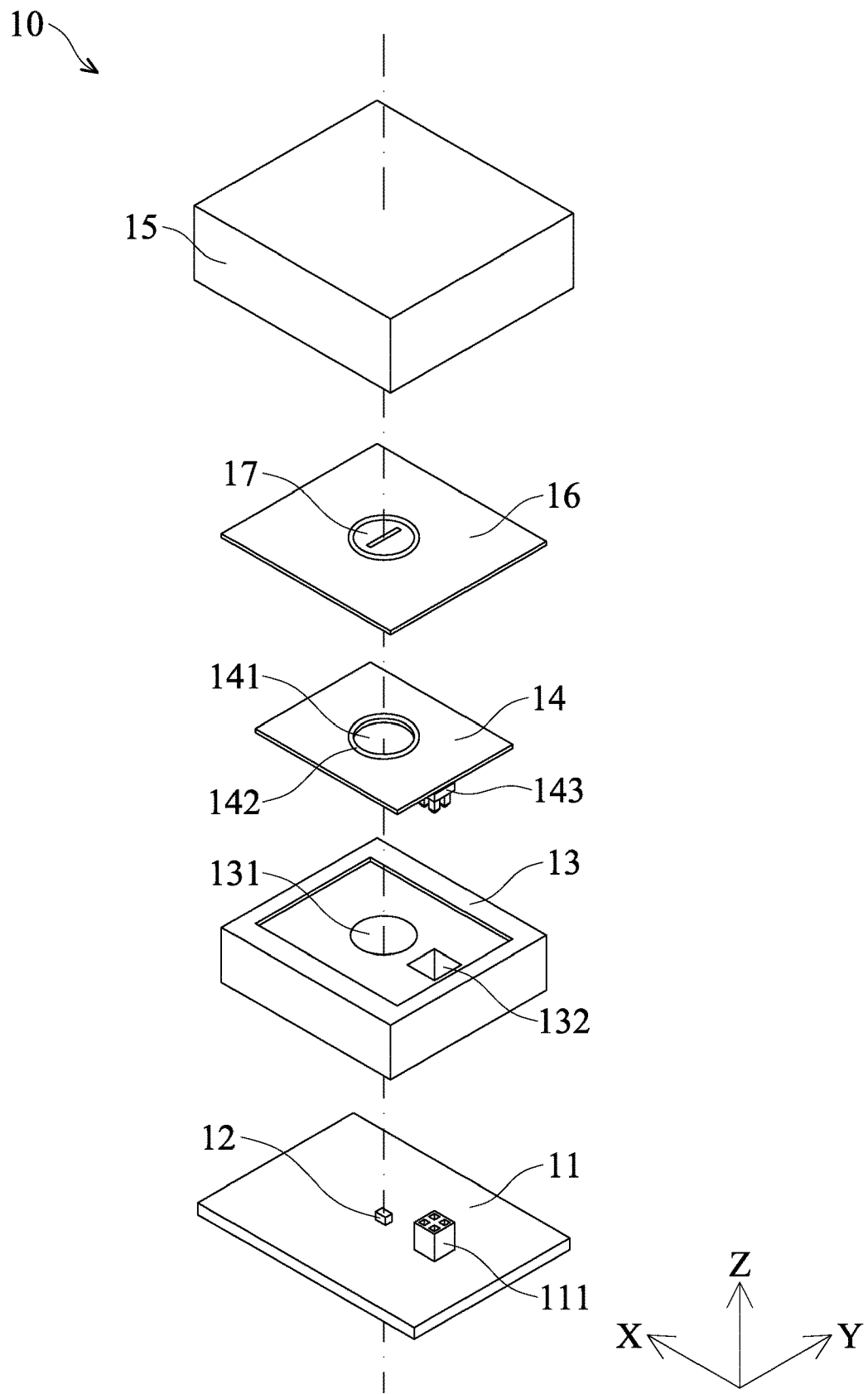
FIG. 2 is an exploded view illustrating the touch device shown in FIG. 1.

FIG. 2 is an exploded view illustrating the touch device 10 shown in FIG. 1. In the present embodiment, the touch device 10 includes a substrate 11, a light-emitting element 12, a light-shielding member 13, a sensing board 14, a light-passing board 15, and a thin film 16. For example, the substrate 11 may be a printed circuit board (PCB) or any other substrate that circuits are disposed therein. A first connecting member 111 is disposed on the substrate 11 in order to be electrically connected to the sensing board 14 of the touch device 10. The light-emitting element 12 is disposed on the substrate 11, wherein the light-emitting element 12 may be a light-emitting diode (LED) or any other element that may be configured to illuminate. The light-shielding member 13 is disposed on the substrate 11, and has a first opening 131 penetrating the light-shielding member 13. The light-emitting element 12 is disposed in the first opening 131, such that the light L (shown in FIG. 3) emitted by the light-emitting element 12 may pass through the light-shielding member 13 and travel to the outside.

Figure 3:
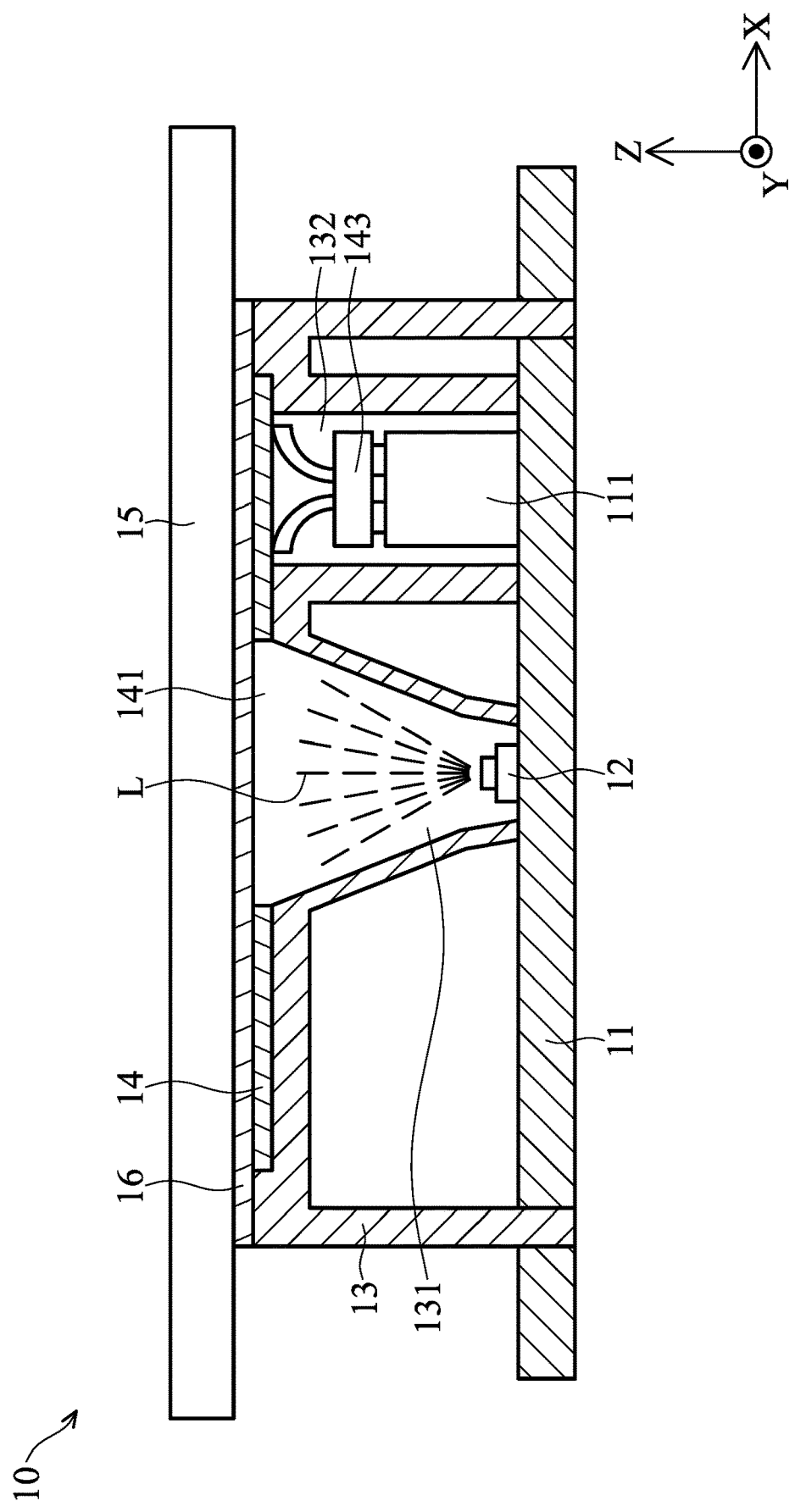
FIG. 3 is a cross-sectional view illustrating the touch device shown in FIG. 1 along line A-A'.

The sensing board 14 is disposed on the light-shielding member 13, wherein the sensing board 14 has a second opening 141 that corresponds to the first opening 131 of the light-shielding member 13. For example, as shown in FIG. 3, when viewed in a vertical direction (Z-axis), the second opening 141 and the first opening 131 substantially overlap. In addition, the sensing board 14 further includes a sensing circuit 142 disposed around the second opening 141. The sensing circuit 142 is configured to detect forces exerted from the outside (such as by users) to the sensing board 14. When the sensing circuit 142 detects that fingers is approaching, the capacitance of the inductive capacitor may be changed. As a result, the sensing circuit 142 may generate electric signals. The sensing board 14 further includes a second connecting member 143 that is electrically connected to the first connecting member 111 via a hole 132 of the light-shielding member 13. Therefore, the sensing circuit 142 may be electrically connected to circuits (not shown) in the substrate 11. Thus, the electric signals may be transmitted to the control unit disposed in the electronic apparatus, such that the electronic apparatus may perform various operations according to the electric signals.

For example, the first connecting member 111 and the second connecting member 143 may be a connector, a rigid conductor (such as a metallic bridge), or a flexible contact element (such as a metallic spring, a conductive rubber, a cable, a flexible flat cable (FFC), and a flexible printed circuit board (FPC)). In the present embodiment, the first opening 131 of the light-shielding member 13 is disposed at the center of the light-shielding member 13, and the hole 132 is disposed beside the first opening 131. However, the first opening 131 and the hole 132 may also be arranged at any other suitable positions in the light-shielding member 13 as required.

In addition, the thin film 16 is disposed on the sensing board 14. For example, the thin film 16 is made of transparent and/or light-guiding materials, making the light emitted by the light-emitting element 12 pass through the thin film 16. In the present embodiment, a pattern 17 is formed on the thin film 16, wherein the pattern 17 may be formed on the thin film 16 by printing, coating, or any other suitable method. That way, after the light pass through the thin film 16, all or a portion of the pattern 17 may be shown. Furthermore, the light-passing board 15 is disposed on the thin film 16. For example, the light-passing board 15 may be ceramic glass or any other transparent material with certain hardness. Accordingly, the effects of protecting the touch device 10 and allowing light to pass through may be achieved at the same time.

Figure 4:
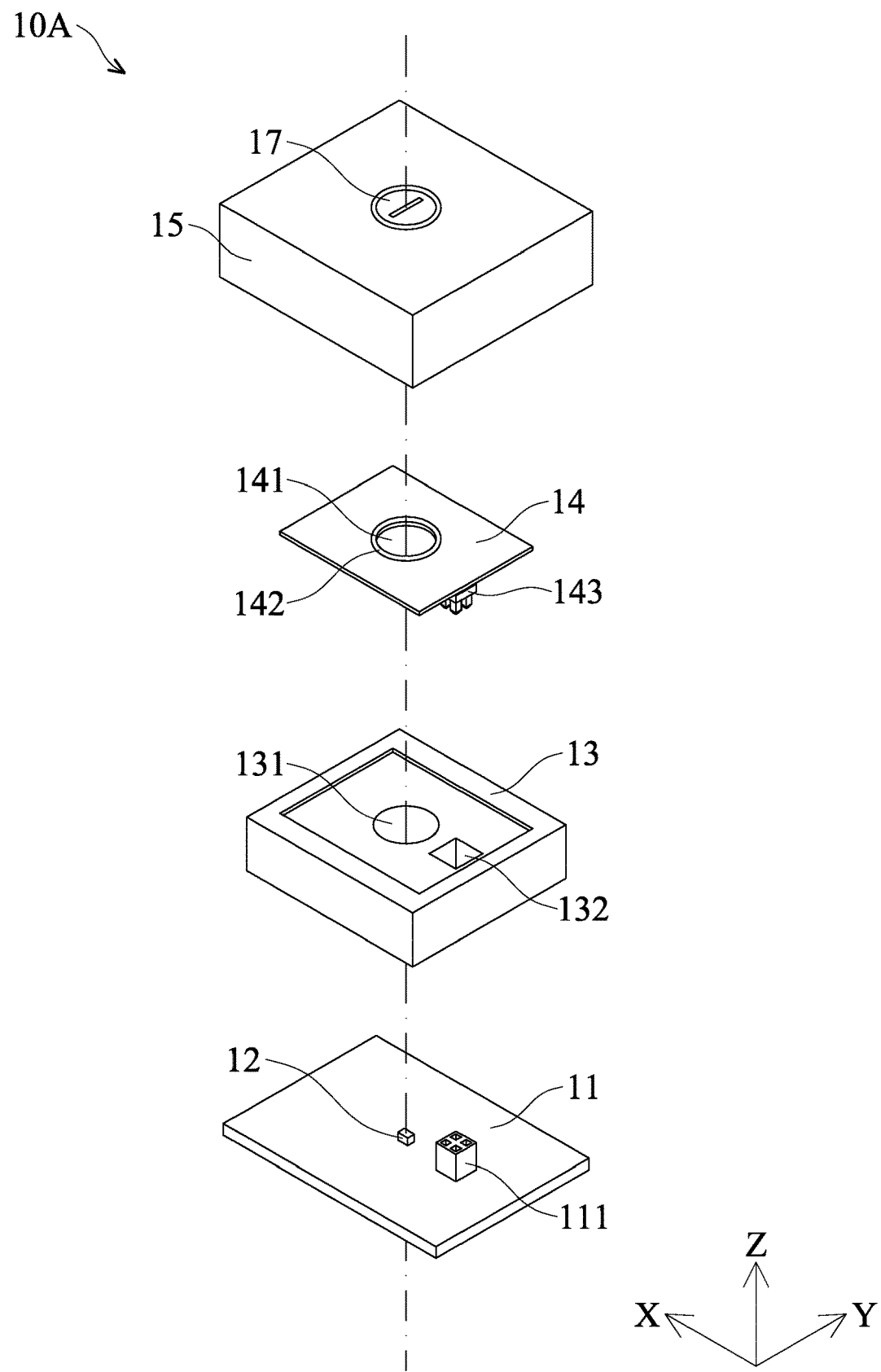
FIG. 4 is an exploded view illustrating a touch device in accordance with another embodiment of the present disclosure.

FIG. 4 is an exploded view illustrating a touch device 10A in accordance with another embodiment of the present disclosure. In the present embodiment, the thin film 16 may be omitted, and the pattern 17 is directly formed on the light-passing board 15 by printing or sintering. Therefore, the overall thickness of the touch device 10A may be reduced. No matter whether the pattern 17 is formed on the thin film 16 or on the light-passing board 15, the process of manufacturing the sensing board 14 may be simplified as long as the pattern 17 is not formed on the sensing board 14. Furthermore, the sensing board 14 may be made of opaque materials, and other lower-cost or higher-strength materials may be used as required.

FIGS. 5A-5D are top views illustrating a sensing board in accordance with some embodiments of the present disclosure. As shown in FIG. 5A, the sensing circuit 142A of the sensing board 14A is disposed around the second opening 141, wherein the sensing circuit 142A has a contact 144A that is configured to transmit the electric signals to the circuits (not shown) of the substrate 11. The aforementioned electric signals may be generated due to the change of the capacitance of the inductive capacitor when detecting that fingers are approaching. In some other embodiments, the sensing circuit may have a plurality of contacts. As shown in FIG. 5B, the sensing circuit 142B is disposed around the second opening 141 and divided into two portions. Both of the portions of the sensing circuit 142B have a contact 144B. It should be noted that the contacts 144B are electrically connected to the circuits of the substrate 11 in parallel connection. That way, even if one of the contacts 144B fails, the electric signals may still be transmitted via the other contact 144B which does not fail. Therefore, the touch device may keep operating as usual, and the failure rate of the touch device may be reduced.

In addition, the sensing circuit may also be designed to be in different shapes as required. As shown in FIG. 5C, the sensing circuit 142C is disposed as a triangle located around the second opening 141. The sensing circuit 142C is divided into three portions, and all of the portions of the sensing circuit 142C have a contact 144C. Moreover, as shown in FIG. 5D, the sensing circuit 142D is disposed as a rectangle located around the second opening 141. The sensing circuit 142D is divided into four portions, and all of the portions of the sensing circuit 142D have a contact 144D. It should be understood that if the sensing circuit is divided into more portions (namely, the sensing circuit has more contacts), the failure rate of the touch device would be lower. In addition, it should be noted that although the above embodiments list various examples regarding to the shapes of the sensing circuit and the number of the contacts, however, those skilled in the art may arbitrarily arrange the shapes of the sensing circuit and the number of the contacts as required.

Figure 6:
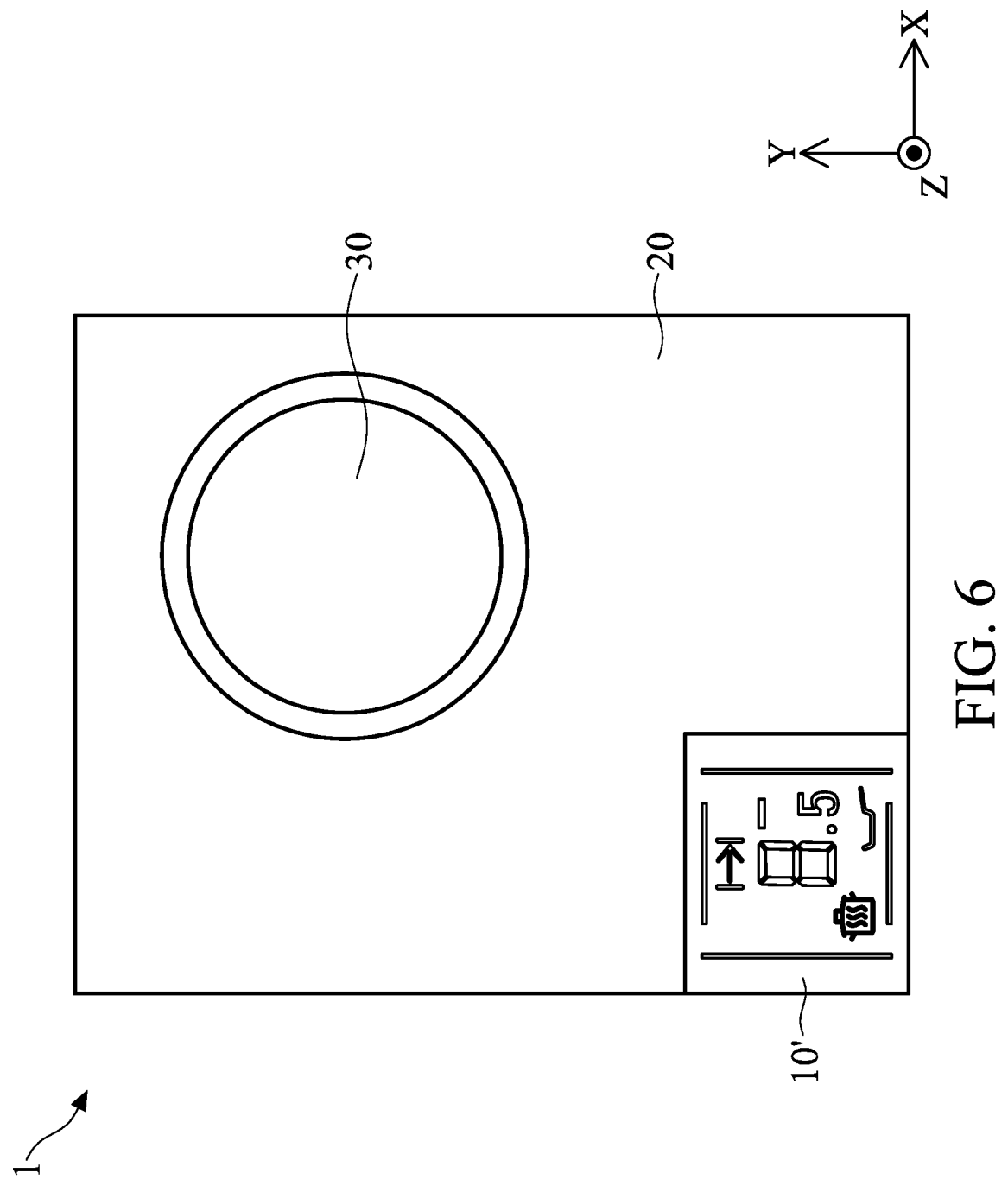
FIG. 6 is a top view illustrating an electric-heating apparatus in accordance with an embodiment of the present disclosure.

FIG. 6 is a top view illustrating an electric-heating apparatus 1 in accordance with an embodiment of the present disclosure. The electric-heating apparatus 1 includes a touch device 10', a body 20, and a heating device 30. The heating device 30 is disposed in the body 20. For example, the heating device 30 may be a resistor, and generate heat by exerting a current to the heating device 30. However, the heating device 30 may be any other device that can generate heat. The touch device 10' is disposed in the body 20. The detailed description regarding to the detailed structure of the touch device 10' will be provided in accompany with FIG. 6 as follows. The touch device 10' is configured to control the operating status of the heating device 30 (such as whether the heating device 30 operates to generate heat), or control the parameter of the heating device 30 (such as the intensity of the generated heat). In addition, the touch device 10' may also show different information according to the status of the heating device 30. It should be understood that although the touch device 10' is used in the electric-heating apparatus 1 in the present embodiment, the touch device 10' may also be disposed in other electronic devices and configured to control the operating status of the electronic devices.

Figure 7:
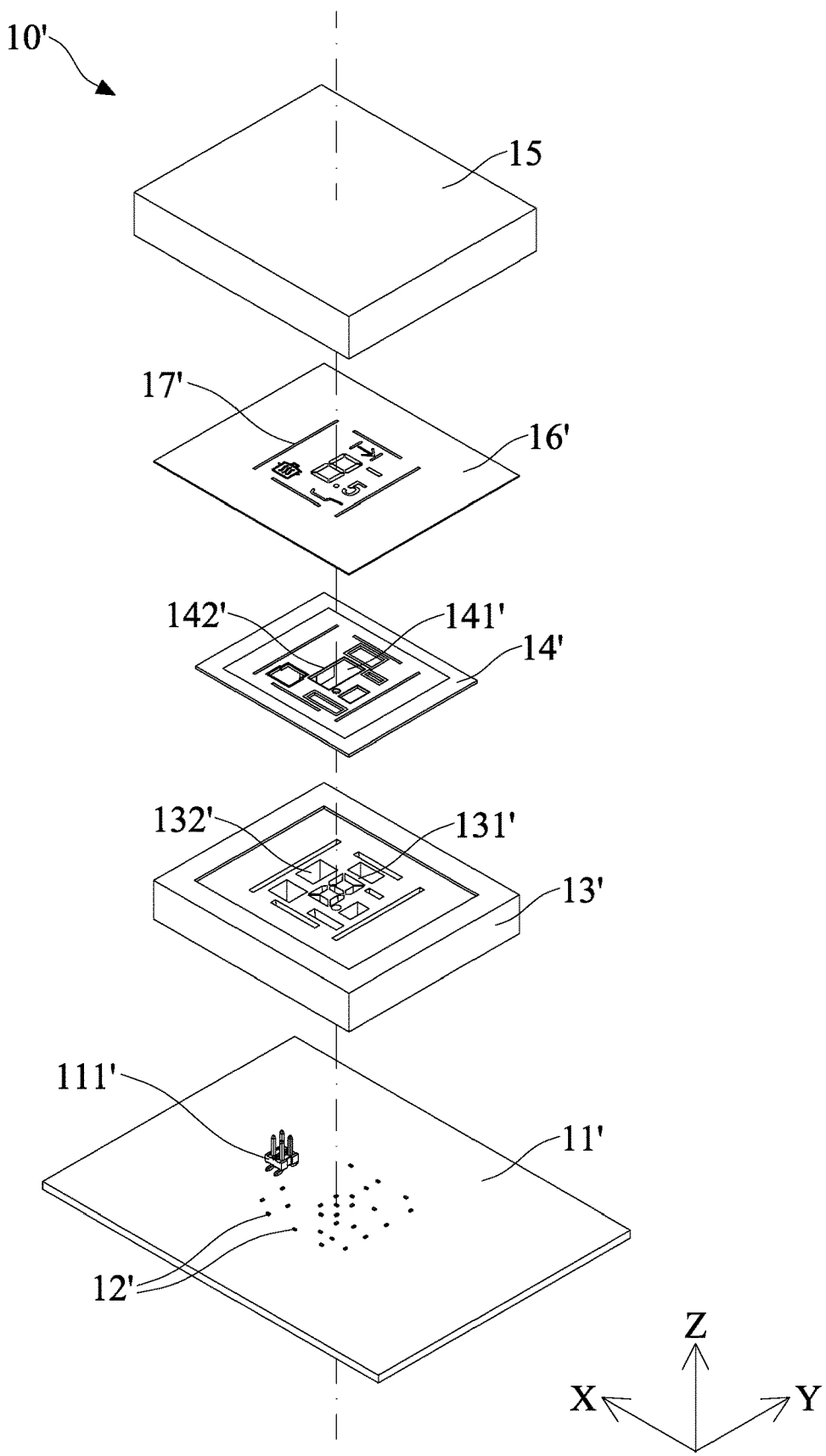
FIG. 7 is an exploded view illustrating the touch device shown in FIG. 6.

FIG. 7 is an exploded view illustrating the touch device 10' shown in FIG. 6. As shown in FIG. 7, the touch device 10' includes a substrate 11', a plurality of light-emitting elements 12', a light-shielding member 13', a sensing board 14', a light-passing board 15, and a thin film 16'. The light-emitting elements 12' are disposed on the substrate 11'. The light-shielding member 13' is also disposed on the substrate 11', and has a plurality of first openings 131' penetrating the light-shielding member 13'. In the present embodiment, the first openings 131' are rectangular and arranged in a specific manner (such as arranged as an 8-shaped to show numbers). In some other embodiments, the first openings 131' may be circles or any other shapes, and may be arbitrarily arranged according to certain display requirement. The light-emitting elements 12' are each disposed in the first openings 131', such that the light emitted by the light-emitting elements 12' may pass through the light-shielding member 13' and travel to the outside.

The sensing board 14' is disposed on the light-shielding member 13', wherein the sensing board 14' has a plurality of second openings 141' that each corresponds to the first openings 131' of the light-shielding member 13'. In other words, when viewed in a vertical direction (Z-axis), each of the second openings 141' and the corresponding first opening 131' substantially overlap. In addition, the sensing board 14' further includes sensing circuits 142' that are disposed around the second openings 141'. The sensing circuits 142' are configured to detect the change of the capacitance of the inductive capacitor when fingers from the outside (such as of users) are approaching the sensing board 14'. As a result, the sensing circuits 142' may generate electric signals. The sensing board 14' further includes a second connecting member (not shown) electrically connected to the first connecting member 111', which is disposed on the substrate 11', via a hole 132' of the light-shielding member 13'.

In addition, the thin film 16' is disposed on the sensing board 14'. For example, the thin film 16' is made of transparent materials, making the light emitted by the light-emitting elements 12' pass through the thin film 16'. A pattern 17' is formed on the thin film 16'. Furthermore, the light-passing board 15 is disposed on the thin film 16'. For example, the light-passing board 15 may be ceramic glass or any other transparent material with a certain hardness. Accordingly, the effects of protecting the touch device 10' and allowing light to pass through may be achieved at the same time.

Figure 8:
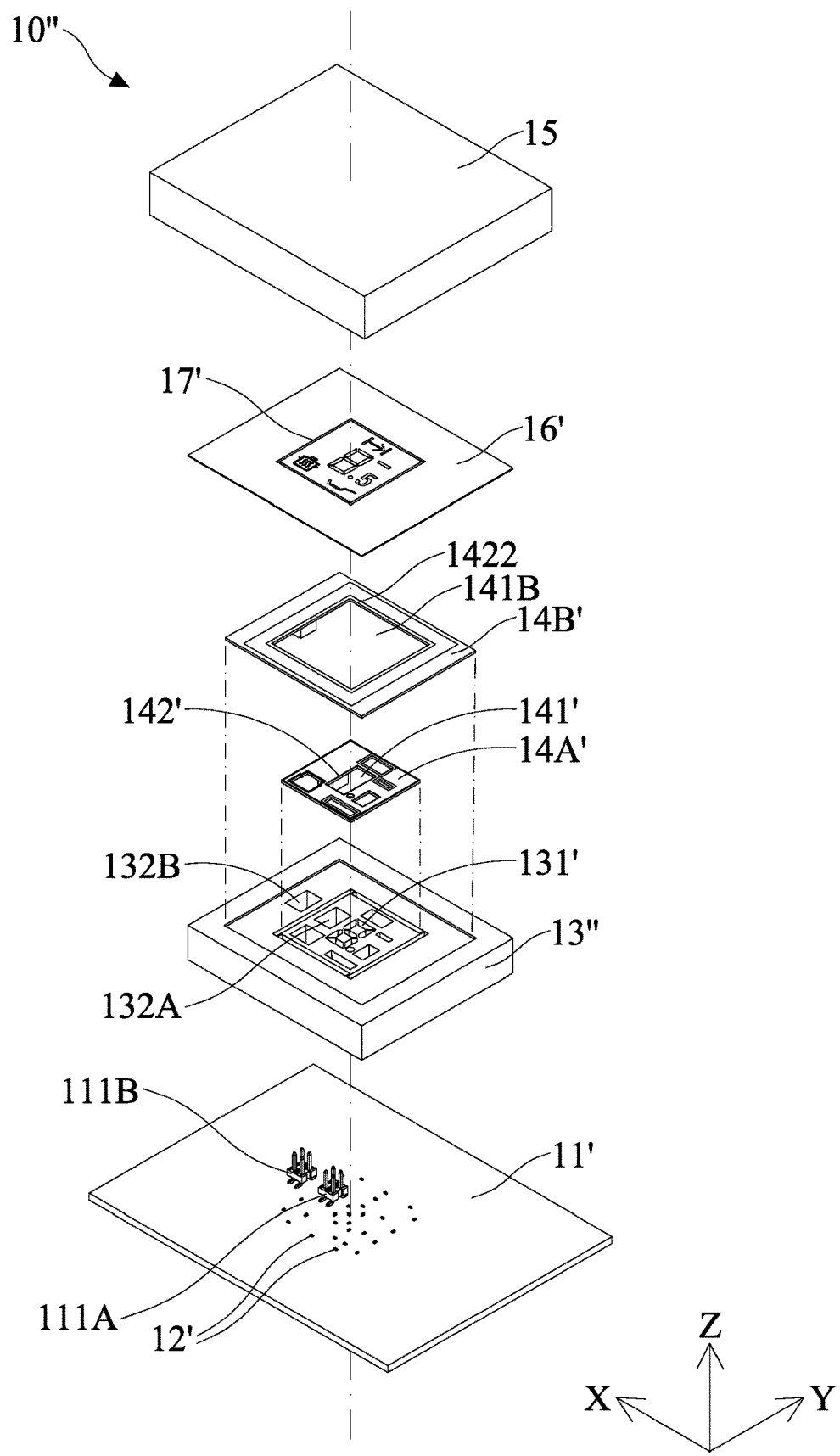
FIG. 8 is an exploded view illustrating a touch device in accordance with another embodiment of the present disclosure.

FIG. 8 is an exploded view illustrating a touch device 10" in accordance with another embodiment of the present disclosure. It should be noted that the touch device 10" may include elements that are the same or similar to the elements of the touch device 10' shown in FIG. 6. Those elements will be labeled as the same or similar numerals, and will not be described in detail again. The difference between the touch device 10" and the touch device 10' shown in FIG. 7 is that the touch device 10" has a first sensing board 14A' and a second sensing board 14B'. A sensing circuit 142' is disposed on the first sensing board 14A', and another sensing circuit 1422 is disposed on the second sensing board 14B'. In the present embodiment, the first sensing board 14A' is disposed in the second sensing board 14B'. That is, the first sensing board 14A' is disposed inside an opening 141B of the second sensing board 14B'. In response to the arrangement of the first sensing board 14A' and the second sensing board 14B', two first connecting members 111A, 111B are disposed on the substrate 11'. The first connecting members 111A is electrically connected to the first sensing board 14A' via a hole 132A of the light-shielding member 13", and the second connecting members 111B is electrically connected to the second sensing board 14B' via another hole 132B of the light-shielding member 13". In other words, the first sensing board 14A' is electrically isolated from the second sensing board 14B'. For example, when the first sensing board 14A' is touched, only the first sensing board 14A' may generate electric signals (the second sensing board 14B' does not generate electric signals), and vice versa. Those electric signals are transmitted to the circuits (not shown) of the substrate 11'.

Compared to touch devices with only one sensing board, those touch devices with multiple sensing boards can control multiple parameters simultaneously. It should be noted that although the arrangement of the first sensing board 14A' and the second sensing board 14B' is illustrated in the present embodiment, it merely serves as an example, and is not intended to limit the present disclosure. Those skilled in the art may adjust the number, the position, and/or the controlled parameters of the sensing boards as required.

As set forth above, the present disclosure provides a touch device that includes a sensing board with an opening. Compared to traditionally forming a pattern on the sensing board of the touch device, the process of manufacturing the sensing board may be simplified as long as the pattern is not formed on the sensing board. Furthermore, the material of the sensing board may not be limited to transparent materials, such that the related cost may be reduced.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A touch device, comprising:
    a substrate having a top surface and comprising a first connecting member disposed on the top surface of the substrate;
    a light-emitting element disposed on the top surface of the substrate;
    a light-shielding member disposed on the top surface of the substrate, wherein the light-shielding member has a first opening, and the light-emitting element is located in the first opening, wherein the light-shielding member is located between the first connecting member and the light-emitting element, and the first connecting member and the light-emitting element are separated by the light-shielding member, thereby the first connecting member is completely blocked from the light-emitting element by the light-shielding member, wherein the light-shielding member further has a hole, the hole and the first opening penetrate on the same plane, and a central axis of the hole is parallel to a central axis of the first opening and perpendicular to said same plane, and the first connecting member is located in the hole;
    a sensing board, disposed on the light-shielding member, and electrically connected to the substrate via the first connecting member, wherein the sensing board has a second opening, and the first opening and the second opening overlap; and
    a light-passing board, disposed on the sensing board, covering the first opening and the second opening.

2. The touch device as claimed in claim 1, further comprising a thin film disposed between the sensing board and the light-passing board.

3. The touch device as claimed in claim 2, wherein a pattern is formed on the thin film, and the light emitted by the light-emitting element passes through the thin film and shows the pattern.

4. The touch device as claimed in claim 1, wherein a pattern is formed on the light-passing board, and the light emitted by the light-emitting element passes through the light-passing board and shows the pattern.

5. The touch device as claimed in claim 1, wherein the sensing board further comprises a sensing circuit surrounding the second opening.

6. The touch device as claimed in claim 5, wherein the sensing circuit comprises a plurality of contacts disposed in parallel connection.

7. The touch device as claimed in claim 1, wherein the sensing board comprises a second connecting member, and the first connecting member is electrically connected to the second connecting member.

8. The touch device as claimed in claim 7, wherein the first connecting member is electrically connected to the second connecting member via the hole.

9. The touch device as claimed in claim 1, wherein the sensing board further comprises a first sensing board and a second sensing board, the first sensing board is located inside an opening of the second sensing board and electrically isolated from the second sensing board.

10. The touch device as claimed in claim 1, wherein
    the light-shielding member includes a first surface and a second surface opposite from the first surface, and
    the light-emitting element is disposed on a side of the first surface of the light-shielding member, and the first connecting member is provided on a side of the second surface of the light-shielding member.

11. The touch device as claimed in claim 1, wherein the sensing board covers an opening of the hole.

12. The touch device as claimed in claim 1, wherein the sensing board is directly attached to the top surface of the light-shielding member.

13. The touch device as claimed in claim 1, wherein the first opening has a first opening edge contacting the top surface of the substrate and the second opening edge contacting the sensing board, and a size of the second opening edge is substantially the same as a size of the second opening.

14. The touch device as claimed in claim 1, wherein the light-shielding member surrounds an entire body of the first connecting member.

15. An electric-heating apparatus, comprising:
    a body;
    a heating device disposed in the body; and
    a touch device, disposed in the body, is configured to control the operating status of the heating device, wherein the touch device comprises:
        a substrate having a top surface and comprising a first connecting member disposed on the top surface of the substrate;
        a plurality of light-emitting elements disposed on the top surface of the substrate;
        a light-shielding member disposed on the top surface of the substrate, wherein the light-shielding member has a plurality of first openings, and the light-emitting elements are correspondingly located in the first openings, wherein the light-shielding member is located between the first connecting member and the light-emitting element, and the first connecting member and the light-emitting element are separated by the light-shielding member, thereby the first connecting member is completely blocked from the light-emitting element by the light-shielding member, wherein the light-shielding member further has a hole, the hole and the first opening penetrate on the same plane, and a central axis of the hole is parallel to a central axis of the first opening and perpendicular to said same plane, and the first connecting member is located in the hole;
        a sensing board, disposed on the light-shielding member, and electrically connected to the substrate via the first connecting member, wherein the sensing board has a plurality of second openings, and the first openings and the second openings correspondingly overlap; and
        a light-passing board, disposed on the sensing board, is configured to cover the first openings and the second openings.

16. The electric-heating apparatus as claimed in claim 15, wherein
   the light-shielding member includes a first surface and a second surface opposite from the first surface, and
   the light-emitting element is disposed on a side of the first surface of the light-shielding member, and the first connecting member is provided on a side of the second surface of the light-shielding member.

17. The electric-heating apparatus as claimed in claim 15, wherein the sensing board covers an opening of the hole.

18. The electric-heating apparatus as claimed in claim 15, wherein the sensing board is directly attached to the top surface of the light-shielding member.

19. The electric-heating apparatus as claimed in claim 15, wherein the first opening has a first opening edge contacting the top surface of the substrate and the second opening edge contacting the sensing board, and a size of the second opening edge is substantially the same as a size of the second opening.

20. The electric-heating apparatus as claimed in claim 15, wherein the light-shielding member surrounds an entire body of the first connecting member.

\* \* \* \* \*